(12) United States Patent
Gläser et al.

(10) Patent No.: US 6,603,829 B1
(45) Date of Patent: Aug. 5, 2003

(54) PROGRAMMABLE PHASE MATCHING

(75) Inventors: Winfried Gläser, Markt Schwaben (DE); Rudi Müller, Gröbenzell (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 09/403,513

(22) PCT Filed: Apr. 23, 1998

(86) PCT No.: PCT/DE98/01138
§ 371 (c)(1),
(2), (4) Date: Oct. 22, 1999

(87) PCT Pub. No.: WO98/49802
PCT Pub. Date: Nov. 5, 1998

(30) Foreign Application Priority Data

Apr. 25, 1997 (DE) .......................................... 197 17 585

(51) Int. Cl.[7] .............................................. H04L 7/033
(52) U.S. Cl. ...................................... 375/360; 375/373
(58) Field of Search ................................ 375/371, 343, 375/294, 327, 373, 375, 376, 360; 327/145, 146, 147, 156, 141, 150, 152, 153, 158, 161, 159

(56) References Cited

U.S. PATENT DOCUMENTS

| 4,415,984 A | 11/1983 | Gryger et al. | ............... 364/900 |
|---|---|---|---|
| 4,780,891 A | 10/1988 | Guerin et al. | ............... 375/111 |
| 5,610,953 A | * 3/1997 | Betts et al. | ............... 375/373 |
| 5,652,773 A | * 7/1997 | Lu | ............... 375/371 |
| 5,982,833 A | * 11/1999 | Waters | ............... 375/372 |

FOREIGN PATENT DOCUMENTS

| EP | 0 185 779 A1 | 7/1986 | ............. H03L/7/00 |
|---|---|---|---|
| EP | 0 319 761 A2 | 6/1989 | ............. G06F/1/04 |
| EP | 0 419 896 A2 | 4/1991 | ............. H04L/7/033 |
| WO | WO 92/00558 | 1/1992 | ............. G06F/1/04 |

OTHER PUBLICATIONS

K.M. Duch, "Baseband Signal Processing", IEEE Network Magazine, vol. 5, No. 6, Nov. 1991, pp. 39–43.

* cited by examiner

*Primary Examiner*—Tesfaldet Bocure
*Assistant Examiner*—Dung X. Nguyen
(74) *Attorney, Agent, or Firm*—Staas & Halsey LLP

(57) ABSTRACT

In a phase matching circuit for generating a system clock signal for an incoming data signal from a locally existing clock signal, a delay signal is calculated from the detected phase position of the data signal in that a memory addressed with the detected phase position outputs an allocated delay signal. In a specific embodiment, the memory is supplied with an address that is compensated by the most recently identified delay. In a further development, a control comprising the memory shares circuits for a number of data signals. The phase matching, which automatically recognizes a jitter compatibility more suitable for the clocking than the jitter compatibility employed at the moment, can be completely integrated and avoids circuit areas that are operated with a higher bit repetition rate than that of the clock signal.

5 Claims, 9 Drawing Sheets

PROGRAMMABLE PHASE MATCHING

BACKGROUND OF THE INVENTION

The present invention is directed to a method for phase matching between a data signal and a clock signal.

European Patent Application No. 0 419 896 discloses a method wherein a number of phase clock signals exhibiting a same offset relative to one another are derived from a clock signal. A data signal and the phase clock signals are supplied to a data edge recognition means. A distribution signal is outputted from the data edge recognition means.

The distribution signal contains information about positions of edges of the data signal with reference to the individual phase clock signals. A calculating and outputting a delay value from the distribution signal is calculated in and output from a control means. A phase position is matched between the data signal and the clock signal in a data synchronization means. The matching being based on a criterion of a delay value supplied to the data synchronization means.

Data whose phase position is not defined and that also has jitter, pulse distortion and frequency offset must often be processed in transmission systems. A clock can have a jitter and a frequency offset when it derives from a different source. The incoming data is generated and synchronized to a predetermined clock.

SUMMARY OF THE INVENTION

It is an object of the present invention to improve the known phase; matching circuit such that an independent locating of a momentarily larger sampling range is established and, moreover, the jitter compatibility is enhanced.

This object is inventively achieved in accordance with the invention in a method in which a number of phase clock signals exhibiting a same offset relative to one another are derived from a clock signal. A data signal and the phase clock signals are supplied to a data edge recognition means. A distribution signal is determined over a measuring time span equal to a number of cycles of the data signal, the distribution signal containing information about positions of edges of the data signal with reference to the individual phase clock signals. The distribution signal is output from the data edge recognition means. A delay value is calculated and output from said distribution signal in a control means. The calculating and outputting comprising the steps of: addressing a tabularly stored allocation with the distribution signal; based on a criterion of the distribution signal, determining from the tabularly stored allocation a largest interconnected area of the data signal in which no transitions were registered; and outputting the allocated delay value. A phase position is matched between the data signal and the clock signal in a data synchronization means, the matching being based on a criterion of a delay value supplied to the data synchronization means.

By addressing the table with the distribution of the registered data edges, an independent and dependable recognition of not only whether and in what direction the delay value must be modified but also an jitter compatibility that is larger and, thus, better for the clocking of the data signal than the jitter compatibility to which the phase matching has momentarily engaged is established from the allocation stored in the table. The control of the phase matching can ensue with a bit repetition rate that is considerably reduced compared to the bit repetition rate of the data signal. The measuring time span within which transitions of the data signal can be detected is prescribable, particularly to a number of cycles of the data signal, wherewith the phase matching is independent of the content of the data signal. Alternatively, the number of data transitions can be prescribed in order to determine the distribution. Compared to the traditional phase matching of the present invention, the phase matching exhibits an enhanced jitter compatibility. The phase matching circuit of the application can be completely integrated and avoids circuit areas that are operated with a higher bit repetition rate than that of the clock signal.

In an embodiment, in a control means, the most recently determined delay value is stored and supplied to the table as additional addressing. This measure yields an addressing of the table dependent on the most recently identified delay value.

In an embodiment, in a control means, the most recently identified delay value is stored and a distribution signal shifted by the delay value is supplied to the table as addressing. This measure yields a compensation of the most recently identified delay value and, thus, a considerable reduction in the number of entries in the table.

In an embodiment, number of data signals are established to which a data edge recognition means as well as a data synchronization means are respectively allocated and which share the control means. Upon utilization of the perception in accord wherewith the control with a bit repetition rate that is substantially reduced compared to the bit repetition rate of the data signal can ensue, this measure yields a reduction of the percentage outlay for each data input.

In an embodiment, the control is respectively cyclically allocated to one of a number of data signals, whereby the time span for a data signal in which the control is not allocated to it forms a measuring time span. This measure yields a simple determination of the measuring time span.

In an embodiment the matching of the phase position between data signal and system clock signal for a respective measuring cycle is limited to an offset between two neighboring phase clock signals. This measure avoids instabilities.

These and other features of the invention(s) will become clearer with reference to the following detailed description of the presently preferred embodiments and accompanied drawings.

DETAILED DESCRIPTION OF THE PRESENTLY PREFERRED EMBODIMENTS

Figure 1:
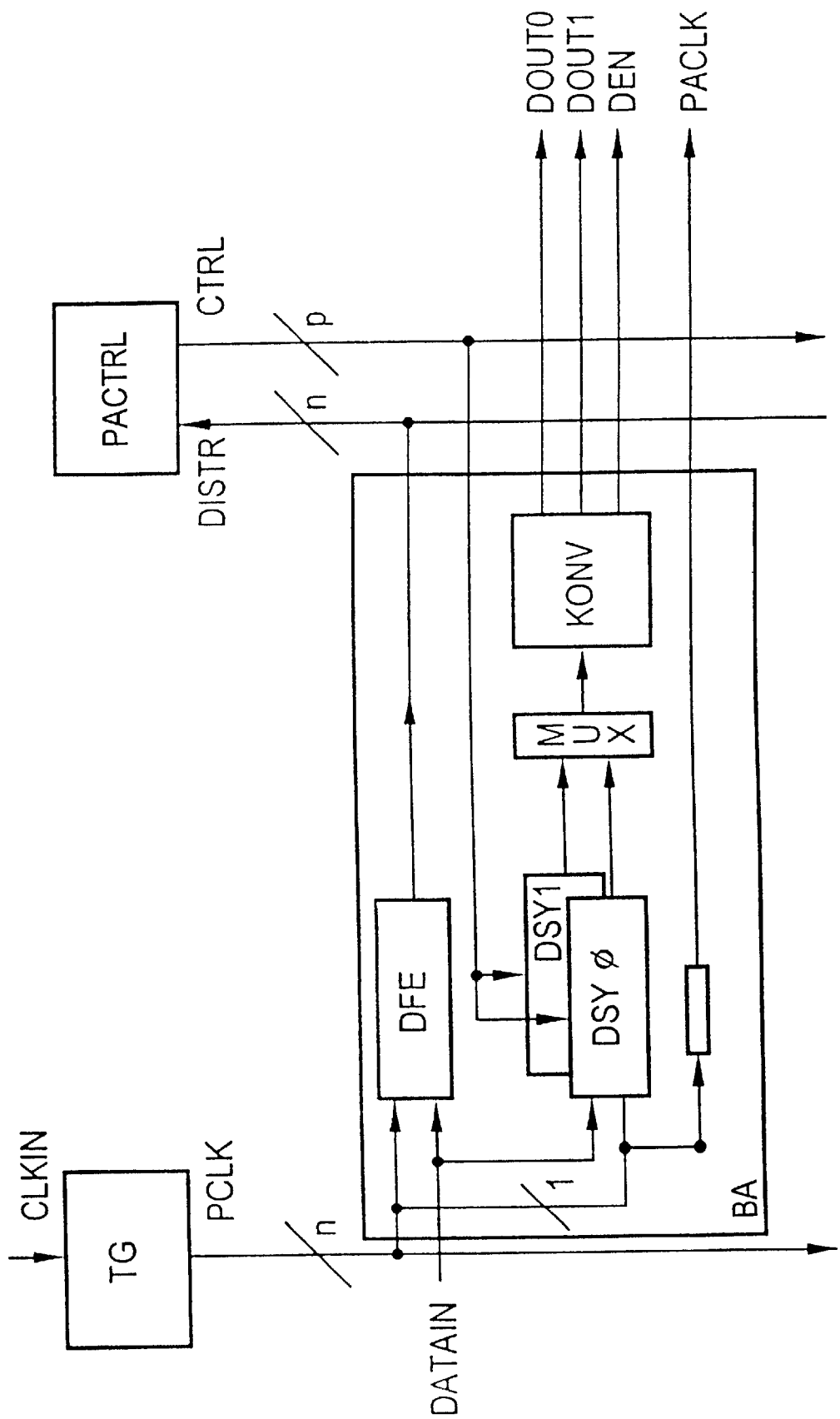
FIG. 1 is a schematic diagram of a phase matching circuit operating in accordance with the present invention.

The phase matching circuit shown in FIG. 1 is formed with a clock generator block TG, a phase matching block BA and a control block PACTRL. The clock generator TG comprises a phase control circuit also known as a phase-locked loop in the technical field to which a locally present clock signal CLKIN is supplied at the input side and that outputs a number of n phase clocks PCLK at the output side. The phase clocks PCLK exhibit the same frequency as the clock signal CLKIN and are shifted relative to one another by respectively the same offset, whereby the accumulated offsets cover a cycle of the clock signal CLKIN.

The phase matching block BA comprises a data edge recognition block DFE to which the phase clocks PCLK and a data input signal DATAIN are supplied. The frequency of the data input signal DATAIN essentially corresponds to the clock signal CLKIN, i.e. the clock signal underlying the data input signal DATAIN is essentially equal to the lock signal CLKIN. The clock signal underlying the data input signal DATAIN can exhibit a phase deviation and/or a frequency deviation compared to the clock signal CLKIN. A phase clock PCLK that exhibits a closest transition is identified in the data edge recognition for the transitions of the data input signal DATAIN. A transition can be established by a change of the status of the pertaining signal from high to low level or from low to high level. The data edge recognition forwards a distribution signal that contains information regarding the position of the transitions of the data signal DATAIN to a control PACTRL. The control PACTRL makes a conclusion about an optimum delay of the data signal based on the distribution signal DATAIN, whereby the data signal DATAIN is optimally sampled in the middle between two transitions. The control PACTRL sends a delay setting signal CTRL to a data synchronization DSY0, DSY1 redundantly provided in the phase matching block BA. The data synchronization DSY0, DSY1 delays the data signal DATAIN supplied to it at an input side according to an criterion of the delay setting signal CTRL. A data diplexer MUX respectively merges one of the portions of the data signal output by the two data synchronizations DSY0, DSY1 to form the data signal. The data signal is supplied to a 1-to-2 converter KONV that divides it onto two output lines DOUT0, DOUT1. The divided data signal is forwarded on the output lines. The 1-to-2 converter KONV outputs a division signal DEN (standing for: data enable) onto a line carried along parallel to the output lines, this signal DEN containing information about how the data signal is divided onto the output lines DOUT0, DOUT1. The data signal conducted on the two output lines DOUT0, DOUT1 is synchronous to the system clock signal PACLK that is forwarded on a line conducted parallel to the output lines DOUT0, DOUT1.

Figure 2:
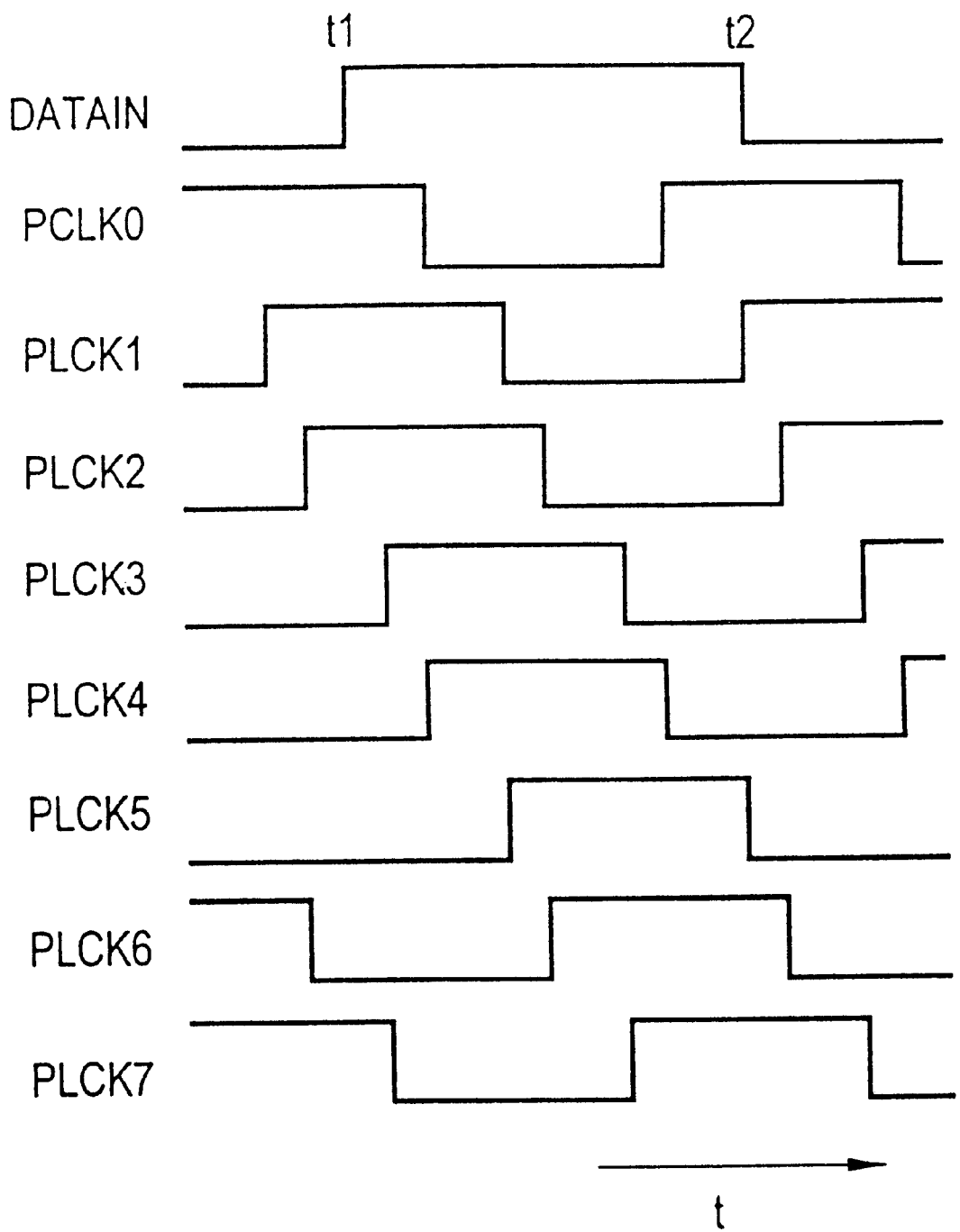
FIG. 2 is an illustration of the phase clocks and of the data signal in the time domain.

FIG. 2 shows a time presentation of the phase clocks PCKL generated by the clock generator TG. The n phase clocks are respectively offset by an angle $2\pi/n$ for a cycle $2\pi$ of the clock signal CLKIN. In an exemplary embodiment, n=8 phase clocks are established, these being provided with the ascending names PCKL0 . . . PCLK7 in the sequence of increasing delay. A bit with the duration of a bit with the transition (status change) from low to high level (positive transition) at time t1 and from high to low level (negative transition) at time t2 is shown in the line DATAIN for the data input signal.

Figure 3:
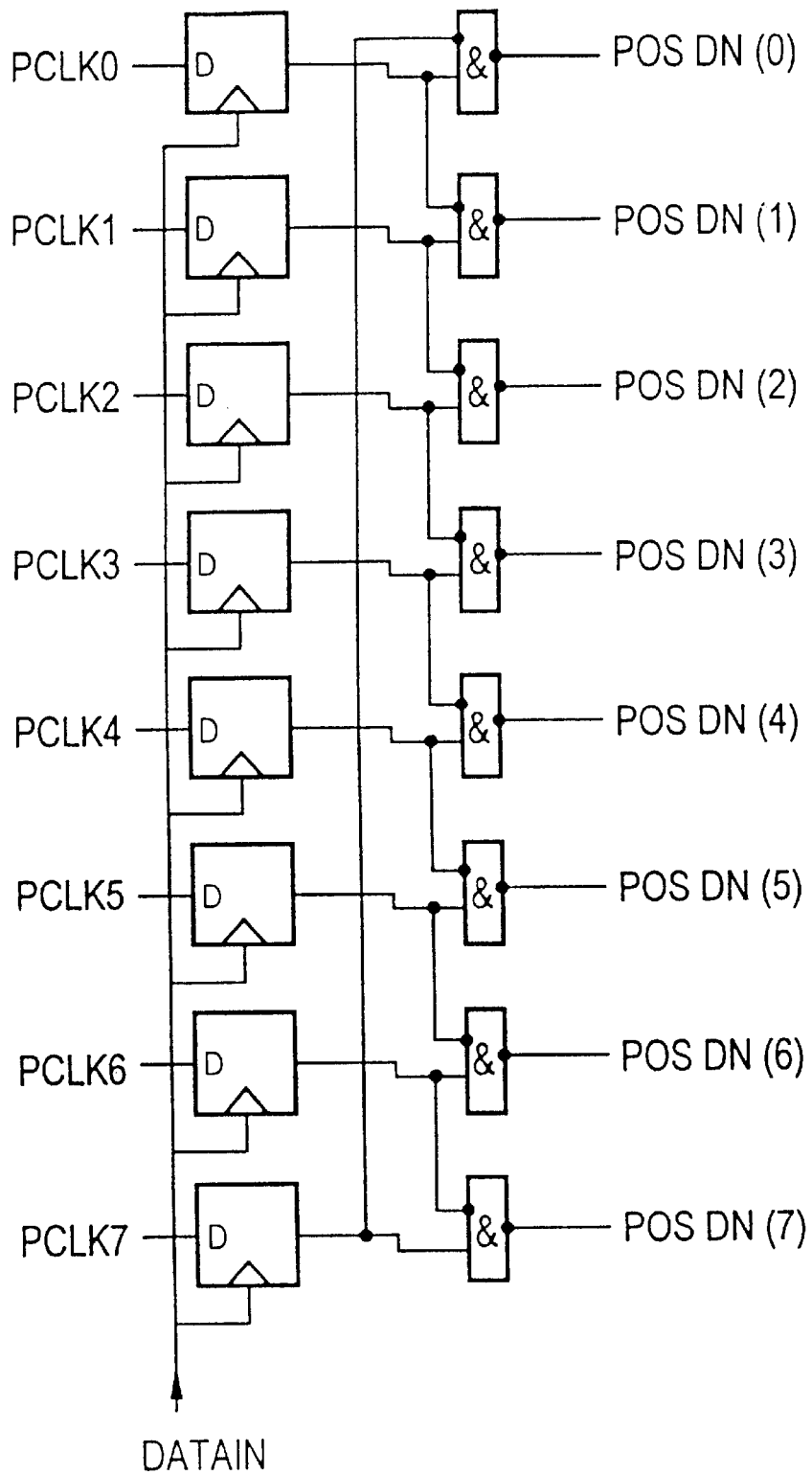
FIG. 3 is a schematic block diagram generating the distribution of the positive data edges.
Figure 4:
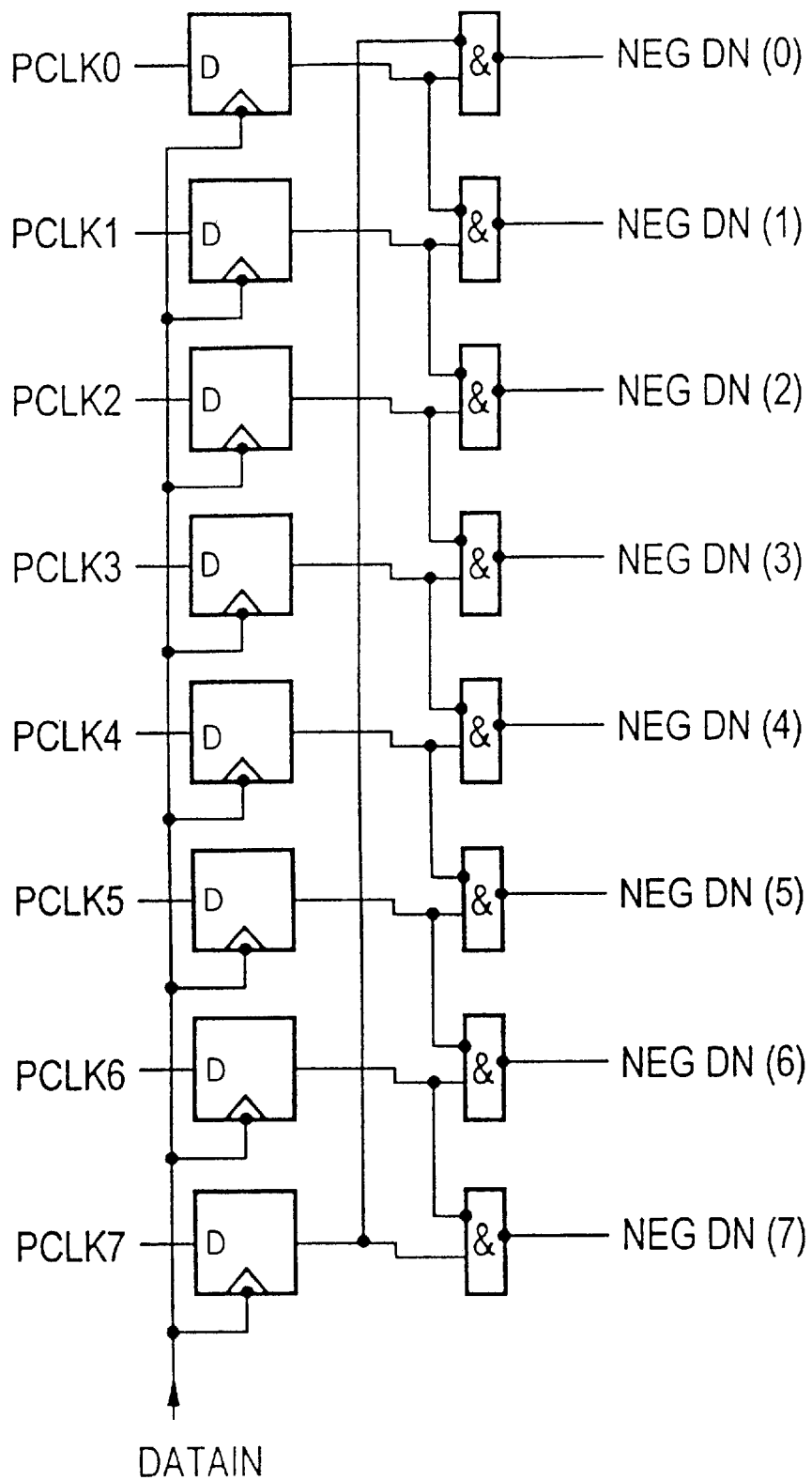
FIG. 4 is a schematic block diagram for generating the distribution of the negative data edges.
Figure 5:
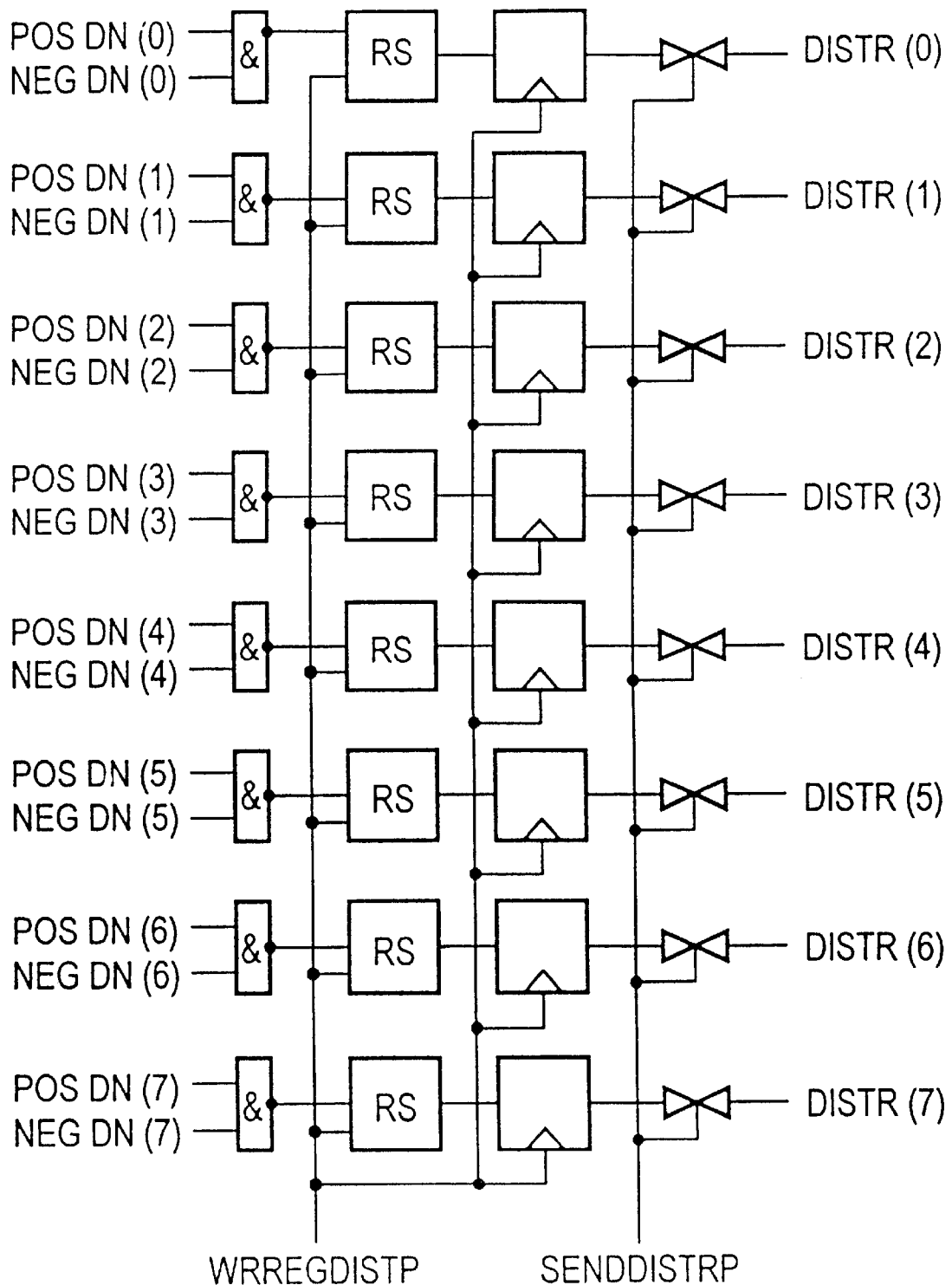
FIG. 5 is a schematic block diagram for generating the distribution of the positive as well as the negative data edges.

The data edge recognition block DFE comprises the circuit shown in FIG. 3 for generating the distribution of the positive data edges, the circuit shown in FIG. 4 for generating the distribution of the negative data edges, and the circuit shown in FIG. 5 for generating the distribution of the positive as well as of the negative data edges.

Given the circuit shown in FIG. 3 for generating the distribution of the positive data edges, a trigger circuit formed with a D-flip flop and a gate realizing the logical NAND function is established for every phase clock PCLK0 . . . PCLK7. The flip flop has its input referenced D charged with the pertaining phase clock and has its trigger input sensitive for a status change from a low level to a high level charged with the data input signal DATAIN. The output of the flip flop is connected to an input of the pertaining NAND gate. The other input of an NAND gate is charged with the inverted output signal of the flip flop to which the phase clock having the cyclically preceding name is allocated. Upon appearance of a positive transition of the data input signal DATAIN the indicated circuit effects that an output signal is generated only for one of all phase clocks, this output signal being different from the output signals generated for the other phase clocks. Upon appearance of a positive transition of the data input signal DATAIN in the interval between the negative transitions of two successive (neighboring) phase clocks, the different output signal for the phase clock that corresponds to the more highly delayed phase clock among the two is generated. The NAND gates output the output signals POSDN(0) . . . POSDN(7) at their outputs whose conditions thus exhibit an information about the data edge distribution (position) of the positive data edge.

Given the circuit shown in FIG. 4 for generating the distribution of the negative data edges, a trigger circuit formed with a D-flip flop and a gate realizing the logical NAND function is established for each phase clock PCLK0 . . . PCLK7. A flip flop has its input referenced D charged with the pertaining phase clock and has its trigger input sensitive for a status change from a high level to a low level charged with the data input signal DATAIN. The output of a flip flop is connected to an input of the pertaining NAND gate. The other input of an NAND gate is charged with the inverted output signal of the flip flop that is allocated to the phase clock having the cyclically preceding name. Given appearance of a negative transition of the data input signal DATAIN the indicated circuit effects that one output signal is generated only for one of all phase clocks, this output signal being different from the output signals generated for the other phase clocks. Given appearance of a negative transition of the data input signal DATAIN in the interval between the positive transitions of two successive (neighboring) phase clocks, the different output signal for the phase clock that, of the two, corresponds to the more highly delayed phase clock is generated. The NAND gates output the output signals NENDN(0) . . . NEGDN(7) at their outputs whose statuses thus exhibit an information about the data edge distribution (position) of the negative data edge.

The circuit shown in FIG. 5 for generating the distribution of the data edges comprises a NAND gate, a trigger circuit formed with an RS-flip flop, a trigger circuit formed with a D-flip flop and a transversal element for each phase clock PCLK0 . . . PCLK7. The pertaining output signal POSDN(0) . . . POSDN(7) of the circuit for generating the distribution of the positive data edges and the pertaining output signal NEGDN(0) . . . NEGDN(7) of the circuit for generating the distribution of the negative data edges is supplied to a NAND gate. The output signal output by the NAND gate is supplied to the input side of the pertaining RS-flip flop and is accepted by it. The output signal output by an RS-flip flop is supplied to the input side of the pertaining D-flip flop. The output signal output by a D-flip flop is supplied to the input side of the pertaining transversal element. The output signals DISTR(0) . . . DISTR(7) output by the transversal elements are forwarded via a bus DISTR to the control PACTRL. In response to an active signal WRREGDISP supplied to the reset input of the RS-flip flop and the trigger input of the D-flip flop, the content of the RS-flip flop is stored in the pertaining D-flip flop and the RS-flip flop is reset into its initial condition immediately thereafter. The distribution is applied onto the bus DISTR with the signal SENDDISTRP and is forwarded to the control PACTRL.

In the example shown in FIG. 2, the output signals POSDN0 . . . POSDN7 —at time t1 with transition of the data input signal DATAIN from the low level to the high level —and the output signals NEGDN(0) . . . NEGDN(7)— at the time t2 with transition of the data input signal from the high level to the low level—assume the following distributions:

| Phase clock number | 01234567 |
|---|---|
| POSDN | 11111110 at time t1 |
| NEGDN | 11111101 at time t2. |

The signal status 0 for the output signal POSDN(7) indicates that a positive transition of the data input signal was detected between the negative transition of the phase clock PCLK6 and the negative transition of the phase clock PCLK7. The signal status 0 for the output signal NEGDN(6) indicates that a negative transition of the data input signal DATAIN was detected between the positive transition of the phase clock PCLK5 and the positive transition of the phase clock PCKL6.

The output signals of the RS-flip flop assume the following distributions at times t1 and t2:

| Phase clock number | 01234567 |
|---|---|
| Content of the RS-FF's | 00000001 at time t1 |
| Content of the RS-FF's | 00000011 at time t2. |

The following content is sent to the control PACTRL on the bus DISTR:

| Phase clock number | 01234567 |
|---|---|
| DISTR | 00000011. |

At the beginning of a measuring time span, the control PACTRL resets the circuit for generating the distribution of the positive as well as the negative data edges according to FIG. 5 into the initial condition with an active signal WRREGDISTP. Immediately thereafter, the RS-flip flops assume the conditions that derive by the output signals POSDN(0) . . . POSDN(7) supplied by the circuit for generating the distribution of the positive data edges and the output signals NEDGN(0) . . . NEGDN(7) supplied by the circuit for generating the distribution of the negative data edges.

When no transition of the data signal has ensued since the preceding active signal WRREGDISTP, the output signals PSODN(0) . . . POSDN(7) or the output signals NEGDN(0) . . . NEGDN(7) stored in the circuit for generating the distribution of the positive data edges and in the circuit for generating the distribution of the negative data edges are supplied. When, thus, no transition of the data signal has occurred for the current measuring time span, work continues with the transition of the data signal that was registered as most recent, as a result whereof the phase matching circuit is prevented from getting out of step and an assumption of a status of the phase matching circuit as though there were an error which accompanies this is advantageously avoided. At the end of the measuring time span, which generally covers a number of durations of a data bit, the control PACTRL interrogates the content adjacent on the bus DISTR. The control PACTRL identifies the largest interconnected area in which no transitions occurred, this being equivalent to the position of a data bit. The control PACTRL selects a phase clock that, insofar as possible, has a transition in the middle of the interconnected region; for the example illustrated in FIG. 2, this is the negative transition of the phase clock PCLK2. The precision of the phase matching increases with increasing number of phase clocks and increasing equidistance between the phase clocks.

Instead of one bit per phase region, a multi-bit counter without overflow can be employed, this counting the number of data transitions. Dependent on the number of bits and the registration duration, one thereby comes very close to the real distribution. The optimum phase position can be identified even better.

For selecting a phase clock, a read-only memory ROM in the control PACTRL is addressed by the content on the bus DISTR. In addition, the read-only memory is addressed with the name of the most recently selected phase clock; given initial commissioning, this can be a pre-set value. In the present exemplary embodiment, an addressing of the read-only memory with 11 bits ensues given a presentation of the distribution on the bus DISTR with 8 bits and encoding of one of the corresponding 8 phase clocks with 3 bits. Based on the criterion of the addressing, a result is output from a table stored in the read-only memory, this allocating a result to each addressing. The allocation is established by selection (retention) of the most recently selected phase clock, by selection of a phase clock that is more highly delayed than the most recently selected phase clock, by selection of a phase clock that is less delayed than the most recently selected phase clock or by displaying an error.

The allocation is based on the following criteria. The center of gravity of the largest interconnected region in which no transitions were registered is selected for the new phase position. When a number of equivalent phase clocks are present, then that one is selected that lies closest the most recently selected phase clock. When, for example, no transition was detected between the phase clock 0 and the phase clock 2, then the phase clock 1 is clearly most beneficial. When, for example, no transition was found between the phase clock 0 and the phase clock 3, then the phase clocks 1 and 2 are initially equivalent. In this case, the higher is always selected in the present realization in order to enhance the jitter compatibility. Dependent on the previous phase clock, it can either continue to be employed or is modified maximally by the offset of a phase clock +T/8 or −T/8 for each cycle established by a measuring time span. Stability is thereby avoided. The name of the most recently selected phase clock is stored and, as described above, addresses the read-only memory.

In an development, a memory with random access RAM is utilized instead of the read-only memory. The determination of the new phase clock and the allocation as to when an error is present can thus be easily modified.

An error is output from the allocation when transitions were registered in each of the areas neighboring the most recently selected phase clock (for example, phase clock 2 previously selected and transitions in the phase region for phase clock 1 and 2 as well as in the phase region for phase clock 2 and 3) or when a larger, free area was found in an entirely different phase region.

In the present invention, thus, a different region and, potentially, a region better than the region established at the moment is recognized for phasing on the distribution made available on the bus DISTR.

The indicated table requires $2^{11}$ entries.

In an embodiment, the distribution made available at the moment on the bus DISTR is shifted by the value of the most recently selected phase clock, whereby an overflow is inserted in case of upward transgression of the phase clock PCLK0. The table is addressed with the shifted distribution, an addressing with 8 bits and $2^8$ entries being thus established in the exemplary embodiment. As a result of this measure, thus, there is a considerable saving in terms of entries. Based on the criterion of the addressing, a result is output from the table deposited in the read-only memory, this allocating a result to each addressing.

The following classes of results are established:

shift phase clock φ upward by 1 phase clock φ remains shift phase clock φ down by 1.

When transitions had been found in both regions $\phi_{alt-1}$ through $\phi_{alt}$ and $\phi_{alt}$ through $\phi_{alt+1}$, an error is output.

Let a synchronization as in the initial commissioning of the phase matching circuit ensue as reaction to an error.

When a phase clock deviating from the most recently selected phase clock has been selected in the control PACTRL, an information identifying this phase clock, the delay setting signal, is transmitted via the control bus CTRL to the data synchronization DSY0 . . . DSY1 redundantly arranged in the phase matching BA. One data synchronization is always managing, whereas the respectively other data synchronization is kept ready to assume the management.

Figure 6:
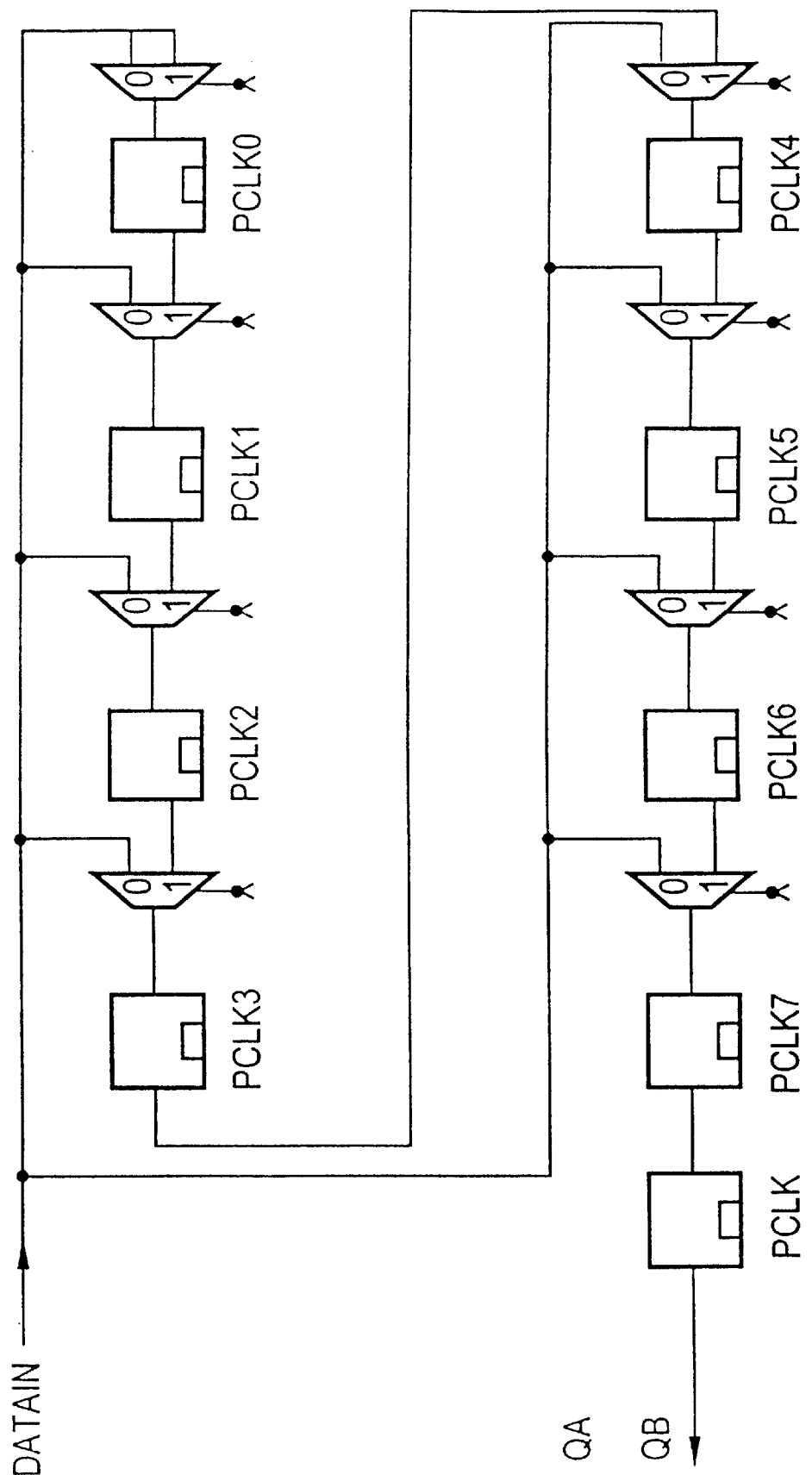
FIG. 6 is a schematic diagram of a block "data synchronization" from FIG. 1.

A data synchronization shown in FIG. 6 is essentially formed with the series connection of a number of delay units equal in number to the number of phase clocks PCLK0 . . . PCLK7. Each unit is formed with a controlled port and a latch that exhibits the function of a D-flip flop with extremely short gate running time. The controlled ports are charged at their input side with the data input signal DATAIN and the output signal of the latch of the preceding unit. The latches have their input sides charged with the output signal of the pertaining port. The phase clocks PCLK0 . . . PCLK7 are respectively supplied to the trigger input of a status-controlled latch, whereby a signal charging the trigger input with a low level inhibits the latch and a signal charging the trigger input with a high level switches the latch transmissive. Phase clocks increasingly delayed from unit to unit in signal flow direction are supplied to the series connection. The delay setting signal supplied from the control PACTRL effects an activation of the port of the unit indicated in the delay setting signal for the data input signal DATAIN as a result whereof the data input signal DATAIN is correspondingly delayed. The signal output by the last unit in signal flow direction is through-connected by a latch that has its trigger input charged with the system clock signal PACLK. Given the described phase matching circuit, thus, the data input signal DATAIN is delayed by the number of offsets identified by the control PACTRL until it is synchronous with the system clock signal CLKIN.

When a phase clock deviating from the most recently selected phase clock has been selected in the control PACTRL, the data synchronization kept ready to assume the management is first set to the delay communicated in the delay setting signal and a switch is then made to this data synchronization. The switching from one data synchronization to the other data synchronization to the other data synchronization ensues by switching a multiplexer MUX, to whose input side the data signals output by the two data synchronizations DSY0, DSY1 are supplied.

Figure 7:
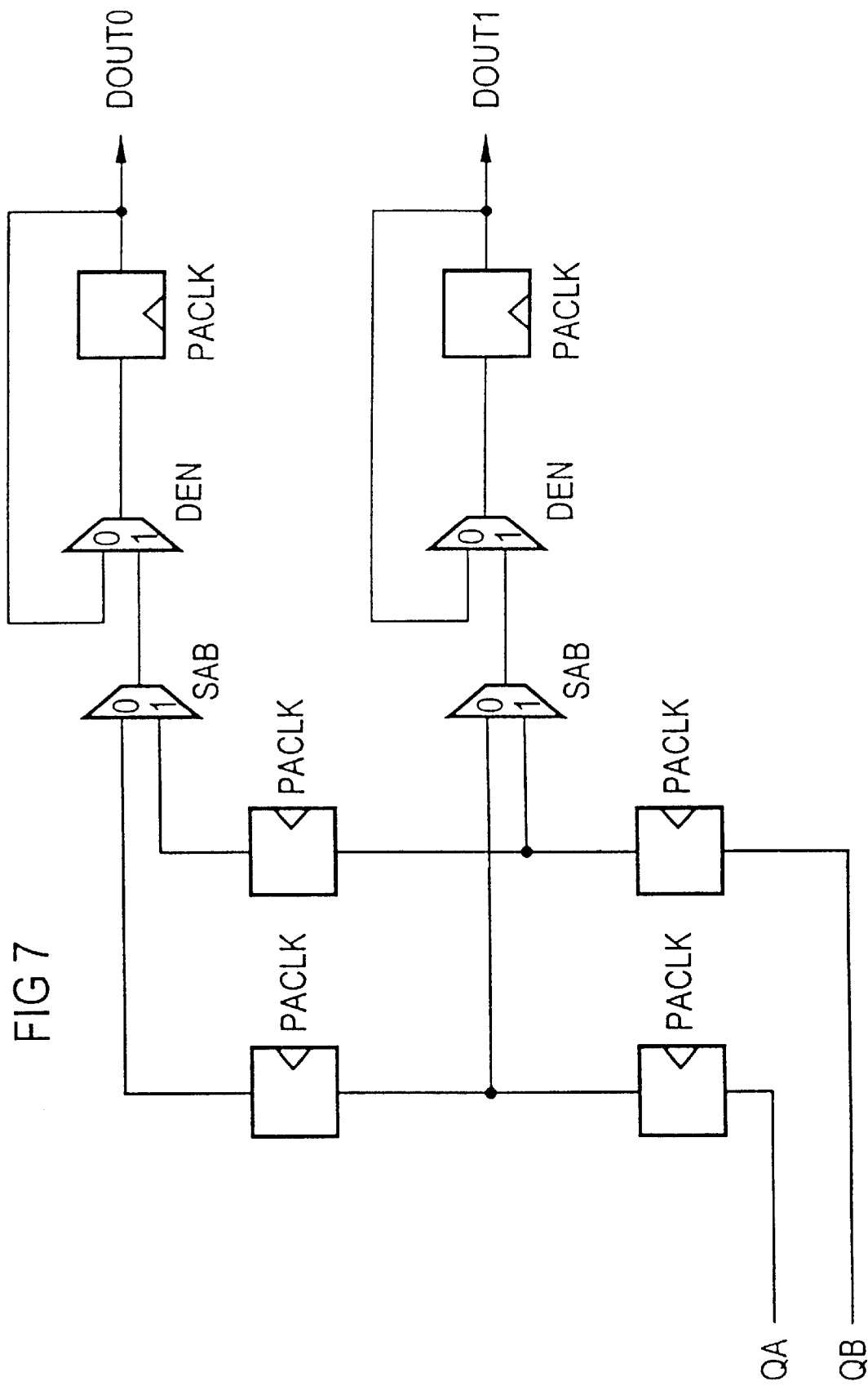
FIG. 7 is a schematic block diagram of a converter for the distribution of a data signal onto two output lines.
Figure 8:
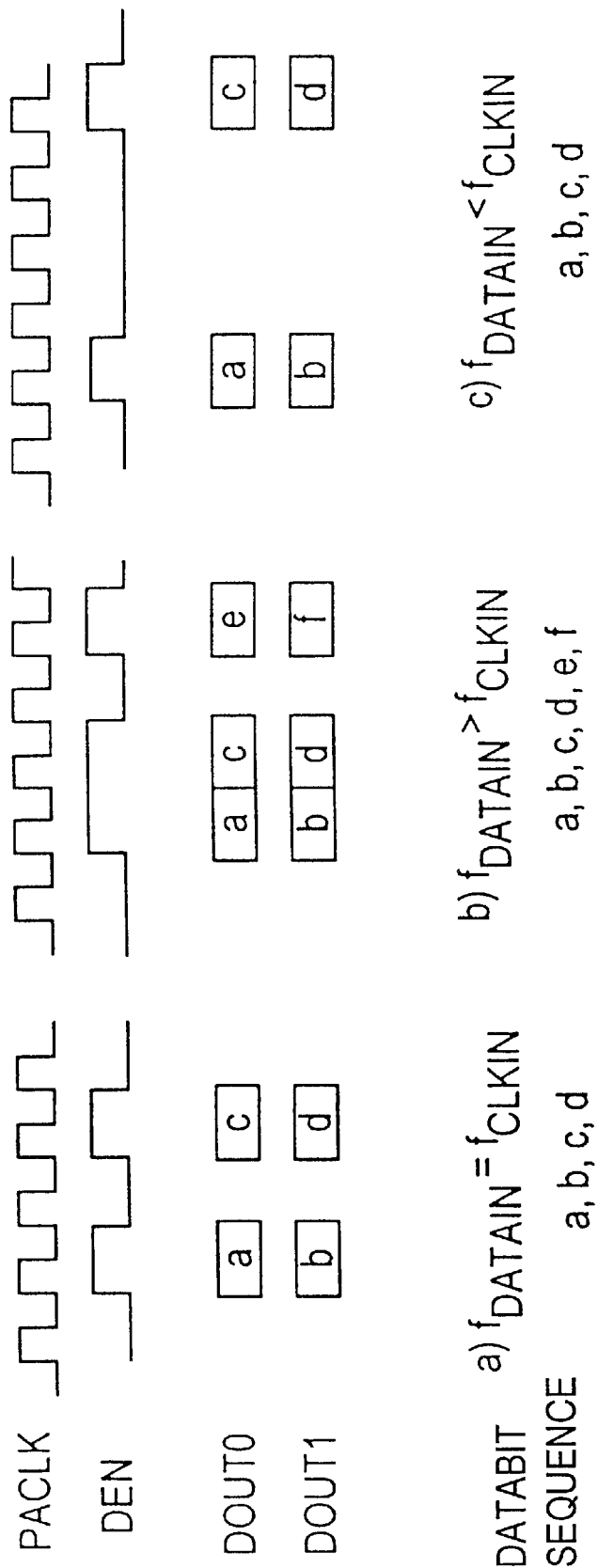
FIG. 8 shows characteristic signal curves for the converter from FIG. 7 dependent on the frequency relationship between data input signal and system clock signal.

In order to avoid data losses due to a consistently higher frequency of the data input signal DATAIN compared to the frequency of the system clock signal CLKIN an output of the data signal on two output lines synchronous with the system clock signal CLKIN fundamentally known from European Patent Application 0 419 896 is provided. The serial-to-parallel converter shown in FIG. 7 distributes the data signal output by the data synchronization DSY0, DSY1 active at the moment onto the two output lines. Given a higher input data rate than the clock frequency, an additional datum is output. Two bits are output parallel given every active DEN signal, as shown in FIG. 8. When, in the course of setting a data synchronization, an end of the series connection of the delay units is reached, a switch is made to the respectively other end and one then continues, whereby the DEN signal is 0 or 1 for two bits in succession dependent on the end from which the switch was undertaken.

In an alternative embodiment, the current phase clock is employed at the data output. The pulse width can, given 8 phase clocks, then change from 1 to ⅞ or 9/8.

When it is assumed that the mutual phase position of clock and data is identical in the creation of the distribution DISTR (clock is clocked off from data edges) and when clocking the data, then one arrives at a theoretical jitter compatibility (eye) of ¾ of the cycle. In the ideal case that this phase relation is shifted to 1/16 T, this value can be improved further.

Figure 9:
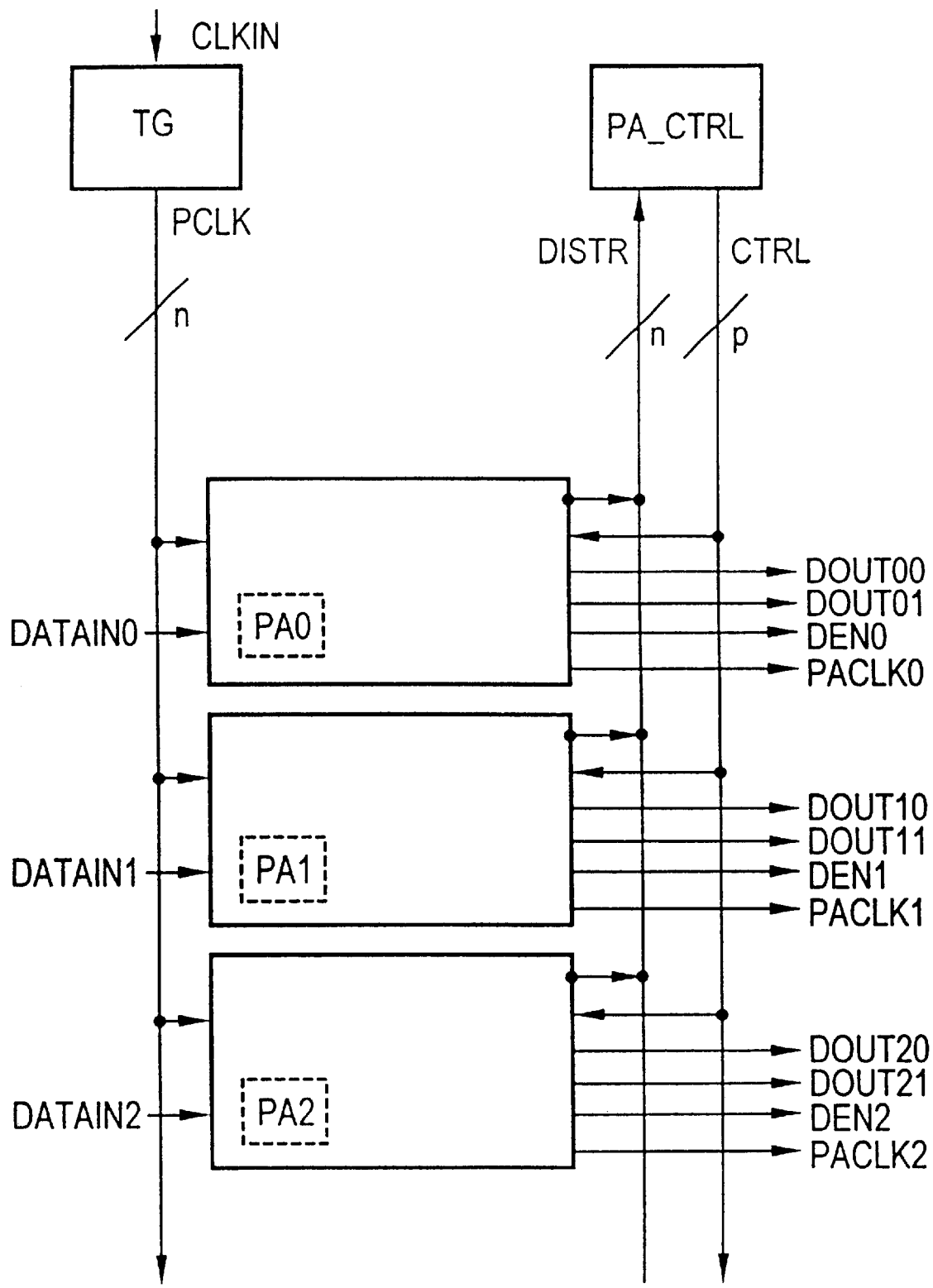
FIG. 9 is a schematic block diagram of the phase matching circuit for a number of data signals.

The phase matching circuit comprises an area of high required processing speed that relates to the path of the data signal and the data edge recognition means and an area of low required processing speed that relates to the control. Whereas the fast part is time-critically constructed with special layout demands, there is no layout demand given the slower layout and it can be constructed with little outlay. Utilizing the perception of areas of different processing speeds and as shown in FIG. 9, a number of data signals are respectively allocated to a data edge recognition means a data synchronization means which share a control. The control cyclically switches between the devices for the data signals. The time span in which the control for the devices of a data signal is not activated forms a measuring time span.

Specific phase positions are prescribed and possible errors are registered for tests.

A typical application of the phase matching circuit of the application is in switching systems given reception of ATM packets in coupler modules.

Although modifications and changes may be suggested by those of ordinary skill in the art, it is the intention of the inventors to embody within the patent warranted hereon all changes and modifications as reasonably and properly come within the scope of their contribution to the art.

What is claimed is:

1. A method for phase matching between a cyclical data signal and a clock signal, said method comprising the steps of:

deriving a number of phase clock signals exhibiting a same offset relative to one another from a clock signal;

supplying a data signal and said phase clock signals to a data edge detector;

determining a distribution signal over a measuring time span equal to a number of cycles of said data signal, said distribution signal containing information about positions of edges of said data signal with reference to said individual phase clock signals;

outputting said distribution signal from said data edge detector;

forming a delay value from said distribution signal by addressing a tabularly stored allocation of delays to different distribution signals, and, based on said distribution signal, selecting a delay value from a table which is allocated to said distribution signal and which represents a largest continuous area between successive transitions; and matching a phase position between said data signal and said clock signal based on said delay value.

2. The method according to claim 1, further comprising the steps of:

storing a most recently formed delay value; and supplying said stored delay value to said tabularly stored allocation as additional addressing.

3. The method according to claim 1, further comprising the steps of:

storing a most recently formed delay value; and supplying a distribution signal shifted by said delay value to said tabularly stored allocation as addressing.

4. The method according to claim 1, further comprising the steps of:

allocating a respective data edge detector to a number of data signals;

cyclically allocating a control to a data signal; and forming said measuring time span from a time span wherein said control is not allocated to a data signal.

5. The method according to claim 1, wherein said respective matching of said phase position between said data signal and said clock signal is limited to an offset between two neighboring phase clock signals.

* * * * *